(12) United States Patent
Chen et al.

(10) Patent No.: US 8,013,604 B2
(45) Date of Patent: Sep. 6, 2011

(54) TEMPERATURE-CONTROLLED MAGNETIC RESONANCE IMAGING METHOD AND APPARATUS

(75) Inventors: Li Ming Chen, Shenzhen (CN); Ting Qiang Xue, Shenzhen (CN); Jian Min Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 354 days.

(21) Appl. No.: 12/328,006

(22) Filed: Dec. 4, 2008

(65) Prior Publication Data
US 2009/0140735 A1    Jun. 4, 2009

(30) Foreign Application Priority Data
Dec. 4, 2007  (CN) .......................... 2007 1 0195527

(51) Int. Cl.
*G01V 3/00*  (2006.01)
(52) U.S. Cl. ........................................ 324/315; 324/318
(58) Field of Classification Search .................. 324/315, 324/318, 322
See application file for complete search history.

(56) References Cited

U.S. PATENT DOCUMENTS

| 6,777,939 B2 * | 8/2004 | Bechtold et al. ............... 324/322 |
| 6,977,501 B2 * | 12/2005 | Kassai et al. .................. 324/315 |
| 7,432,708 B2 * | 10/2008 | He et al. ........................ 324/315 |

* cited by examiner

*Primary Examiner* — Louis M Arana
(74) *Attorney, Agent, or Firm* — Schiff Hardin LLP

(57) ABSTRACT

A method for improving the imaging quality of magnetic resonance imaging (MRI) equipment and MRI equipment, include obtaining a corresponding relationship between a deterioration factor of imaging quality and the cumulative energy of gradient pulses applied by successive scanning MRI sequences, then determining a predicted value of a current deterioration factor of imaging quality according to the currently applied cumulative energy of the gradient pulses and said corresponding relationship, adopting a corresponding method to carry out dynamic regulation or compensation using the predicted value of said deterioration factor of imaging quality as a reference, so as to cancel the influence produced by the heating effect of the gradient system to the imaging quality, thereby effectively improving the imaging quality of the MRI equipment.

18 Claims, 4 Drawing Sheets

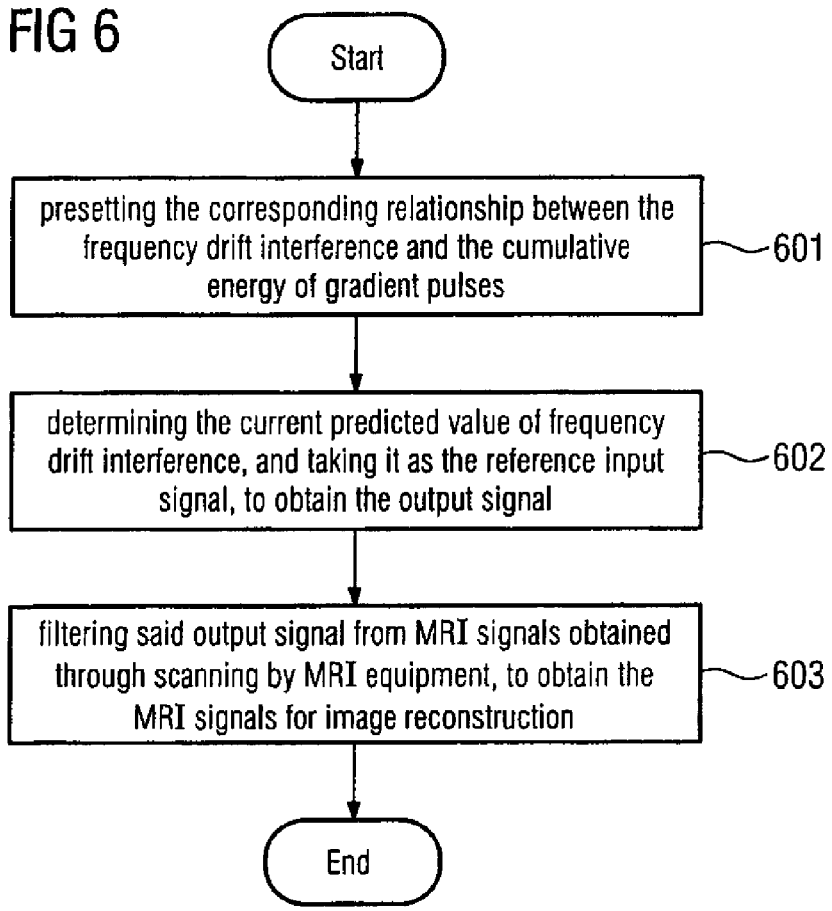
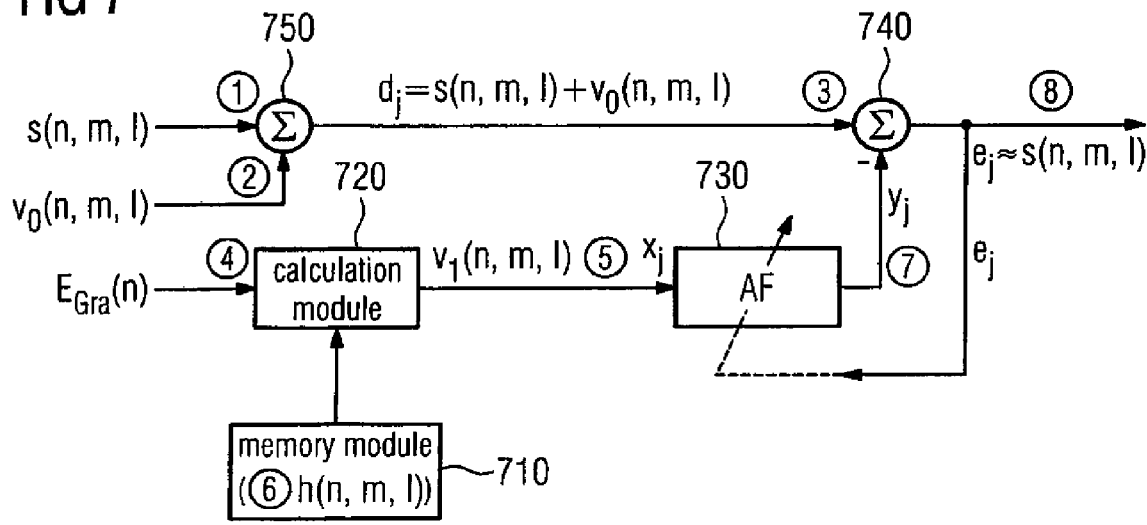

US 8,013,604 B2

TEMPERATURE-CONTROLLED MAGNETIC RESONANCE IMAGING METHOD AND APPARATUS

BACKGROUND OF THE INVENTION

1. Field of the Invention

The present invention relates to the technology of magnetic resonance imaging (MRI) equipment, and particularly to a method for improving the imaging quality of MRI equipment and MRI equipment.

2. Description of the Prior Art

MRI equipment is used to execute magnetic resonance (MR) sequences for obtaining corresponding images. The magnets of MRI equipment, especially of permanent magnetic MRI equipment, for generating the basic magnetic field are generally made of rare earth materials of high magnetic permeability, such as neodymium, iron, boron, etc. A disadvantage of this type of magnet is its very large temperature coefficient, which is sensitive to temperature changes. When the temperature of the magnets changes, it will cause the homogeneity of the magnetic field within an imaging field of view to deteriorate and thus lead to field drifting; according to the Larmor equation, the field drifting will directly cause frequency drifting, thereby leading to deterioration of the imaging quality. There is thus a need to constrain the influence of relevant factors, so as to improve the imaging quality of the MRI equipment. Two types of technical solutions available in the prior art for improving the imaging quality of MRI equipment are introduced below.

The first technical solution is to improve the imaging quality of the MRI equipment by keeping the magnet temperature constant.

In MRI equipment, the magnet temperature generally needs to be maintained at 30° C. to 32° C., while the common room temperature is 18° C. to 25° C. Therefore, a heating element is conventionally arranged in the MRI equipment for heating the magnet, to ensure that the temperature in the MRI equipment can meet the temperature requirements. However, when the MRI equipment is operated continuously to execute the MRI sequences for a long time (for example, several hours), its gradient system will produce a heating effect, which causes significant temperature increase (i.e., causing substantial temperature drifting) in the magnets. In this case, the magnet temperature needs to be reduced, to ensure that its temperature meets the temperature requirements. For this reason, the first technical solution is directed at keeping the magnet temperature constant by controlling the heating time for which the heating element heats the magnet.

FIG. 1 is a schematic view of the structure of known MRI equipment corresponding to the first technical solution. Referring to FIG. 1, the MRI equipment is composed of upper and lower portions which are symmetrical with respect to a central transverse axis. Except for a temperature control device 7, the remaining construction structures of said upper and lower portions are identical. Specifically, each of the upper and lower portions has a radio-frequency transmitting coil 1, a magnet 2, a gradient coil 3, a temperature sensor 4, a heating element 5, a filter board 6, a heating power supply 8 and a relay output switch 9. In the following description, when it is necessary to distinguish the identical elements of the upper and the lower portions, prefixes "upper" and "lower" will be respectively added for distinguishing them. The relationship between various elements in FIG. 1 will be described below using the upper half of the MRI equipment as an example:

The radio-frequency transmitting coil 1 and the gradient coil 3 are wound respectively on the magnet 2, and the radio-frequency transmitting coil 1 is closer to the central transverse shaft than the gradient coil 3.

The temperature sensor 4 is connected to the magnet 2 for measuring the temperature of the magnet 2, and the measured temperature is used as one of the input signals to the temperature control device 7.

One side of the heating element 5 is connected to the magnet 2, while the other side is connected to the relay output switch 9, for regulating the power output by the magnet 2 according to the control of the relay output switch 9, that is, to heat the magnet 2 with a corresponding output power according to the control of the relay output switch 9.

There are four channels of input signals and two channels of output control signals existing in the temperature control device 7. The four channels of input signals are, respectively, the preset set temperature $T_{S1}$ of an upper magnet and the set temperature $T_{S2}$ of a lower magnet, and the temperature $T_{a1}$ of the upper magnet measured by the upper temperature sensor 4 and the temperature $T_{a2}$ of the lower magnet by the lower temperature sensor 4. The two channels of output signals are respectively, a channel of output control signal obtained according to $T_{S1}$ and $T_{a1}$ for controlling the upper heating power supply 8; and another channel of output control signal obtained according to $T_{S2}$ and $T_{a2}$, for controlling the lower heating power supply 8.

The heating power supply 8 is used to switch on or switch off the power supply of the relay output switch 9 according to the control signal received from the temperature control device 7.

The filter board 6 is located between the left half portion of elements and the right half portion of elements. The left half portion of elements includes the temperature control device 7, the heating power supply 8 and the relay output switch 9, while the right half portion of elements comprises: the radio-frequency transmitting coil 1, the magnet 2, the gradient coil 3, the temperature sensor 4 and the heating element 5.

The working principle of the MRI equipment in FIG. 1 is as follows. The temperature control device 7 measures the temperature of the magnet 2 with the temperature sensor 4 and controls the on-off time of the output relay 9 of the heating power supply 8 according to the difference between the measured temperature and set temperature, or regulates the output duty cycle of the heating power supply 8 according to this difference, so as to regulate the output power of the magnet heating element 5 and to keep the magnet temperature as constant as possible.

The temperature control device 7 generally generates the control signals by a proportional/integral/differential (PID) algorithm, and specifically the above-mentioned process for generating the control signal according to the difference between the measured temperature and the set temperature is as follows. The temperature control device 7 regulates its PID parameter according to the difference between the measured temperature and the set temperature, and generates a corresponding control signal by using the PID algorithm, so as to regulate the output power of the heating element 5.

The abovementioned technical solution is intended to dynamically regulate the power output to the magnet 2 simply in accordance with the temperature variation of the magnet 2. However, since the magnet 2 is a huge thermal sink, it is difficult for the PID parameter of aforementioned technical solution to guarantee the synchronization between the regulation of output power and the temperature variations when MRI scanning sequences are running continuously, phenomena such as hysteresis, advance, oscillation, etc., will inevitably exist. Furthermore, the regulation period of the solution is long, allowing substantial temperature fluctuation to exist in the magnets. Therefore it is difficult to achieve the purpose of improving imaging quality.

The second technical solution is to improve the imaging quality of the MRI equipment by compensating inhomogeneities of the magnetic field that occur.

FIG. 2 is a schematic view of the structure of known MRI equipment corresponding to the currently available second technical solution. Referring to FIG. 2, structurally similar to the MRI equipment shown in FIG. 1, the MRI equipment is composed of an upper portion and a lower portion which are symmetrical with respect to a central transverse axis. The MRI equipment includes a radio-frequency transmitting coil 1, a magnet 2, a gradient coil 3 and a filter board 6, and further has a shim coil 10 and a shim power supply 11. The relationship of various elements shown in FIG. 2 is explained using the upper half of the MRI equipment as an example.

The radio-frequency transmitting coil 1 and the gradient coil 3 are wound respectively on the magnet 2, and the radio-frequency transmitting coil 1 is closer to the central transverse shaft than the gradient coil 3.

The shim coil 10 is wound on the magnet 2, and is positioned between the radio-frequency transmitting coil 1 and the gradient coil 3, and the shim power supply 11 provides power supply to the shim coil 10.

The working principle of the MRI equipment shown in FIG. 2 is as follows. A multi-step (multi-channel) shim coil 10 and a multi-step (multi-channel) shim power supply 11 are designed so as to detect the homogeneity of the basic magnetic field before executing sequence for scanning and the homogeneity of the basic magnetic field is compensated by regulating the current flowing through the shim coil 10. This solution is high in costs and complicated in its regulation, furthermore, it is difficult to dynamically compensate the field drifting generated during the sequence scanning. Therefore it is difficult to achieve the goal of improving imaging quality.

It can be seen from the above description that, in the currently available technical solutions there are respective shortcomings in improving the imaging quality of MRI equipment, and it is difficult for either approach to achieve the goal of improving the imaging quality.

SUMMARY OF THE INVENTION

In view of the above situation, an object of the present invention is to provide a method for improving the imaging quality of MRI equipment, so as to improve the imaging quality of MRI equipment.

An object of the present invention is also to provide corresponding MRI equipment, to achieve the goal of improving imaging quality.

The present invention provides a method for improving the imaging quality of nuclear magnetic resonance imaging (MRI) equipment, that include the steps of presetting a corresponding relationship between a magnet temperature drifting trend of a magnet used for imaging by the MRI equipment and the cumulative energy of gradient pulses, presetting a set temperature for the magnet, determining the temperature of the magnet to which the current value of the cumulative energy of the gradient pulses corresponds according to the current value of the cumulative energy of the gradient pulses and the preset corresponding relationship and using the magnet temperature as a current predicted value of the magnet temperature, measuring a current temperature of the magnet as the current measured value of the magnet temperature, weighting the current predicted value and the current measured value of the magnet temperature with preset weight coefficients, so as to obtain an actual temperature of the magnet, and adjusting a proportional/integral/differential (PID) parameter of a temperature control device according to the difference between the magnet's actual temperature and set temperature, so as to keep the temperature of the magnet constant.

In this case, the magnet can be formed by an upper magnet and a lower magnet. Presetting the corresponding relationship between the magnet temperature drifting trend and the cumulative energy of gradient pulses can be accomplished by presetting a corresponding relationship between the temperature drifting trend of the upper magnet and the cumulative energy of the gradient pulses and a corresponding relationship between the temperature drifting trend of the lower magnet and the cumulative energy of the gradient pulses. Presetting the set temperature for the magnet can be done by presetting a set temperature for the upper magnet and a set temperature for the lower magnet.

In this case, determining the temperature of the magnet to which the current value of the cumulative energy of the gradient pulses corresponds according to the current value of the cumulative energy of the gradient pulses and the preset corresponding relationship can be accomplished determining the temperature of the upper magnet to which the current value of the cumulative energy of the gradient pulses corresponds according to the current value of the cumulative energy of the gradient pulses and the corresponding relationship between the temperature drifting trend of the upper magnet and the cumulative energy of the gradient pulses, and determining the temperature of the lower magnet to which the current value of the cumulative energy of the gradient pulses corresponds according to the current value of the cumulative energy of the gradient pulses and the corresponding relationship between the drifting trend of the lower magnet and the cumulative energy of the gradient pulses. Using the magnet temperature as the current predicted value of the magnet temperature can be done by using said determined temperature of the upper magnet corresponding to the current value of the cumulative energy of the gradient pulses as the current predicted value of the upper magnet temperature; and using the determined temperature of the lower magnet corresponding to the current value of the cumulative energy of the gradient pulses as the current predicted value of the lower magnet temperature.

In this case, the measuring the current temperature of the magnet as the current measured value of the magnet temperature can be accomplished measuring a current temperature of the upper magnet to obtain the current measured value of the upper magnet temperature, and measuring a current temperature of the lower magnet to obtain the current measured value of the lower magnet temperature.

In this case, weighting the current predicted value and the current measured value of the magnet temperature with preset weight coefficients, so as to obtain the actual temperature of the magnet can be done by weighting the current predicted value of the upper magnet temperature and the current measured value of the upper magnet temperature with the preset weight coefficients, so as to obtain an actual temperature of the upper magnet, and weighting the current predicted value of the lower magnet temperature and the current measured value of the lower magnet temperature with the preset weight coefficients, so as to obtain an actual temperature of the lower magnet.

In this case, adjusting the proportional/integral/differential (PID) parameter of the temperature control device according to the difference between the magnet's actual temperature and set temperature can be done by adjusting a proportional/integral/differential (PID) parameter for controlling the upper magnet temperature in the temperature control device according to the difference between the upper magnet's actual temperature and the upper magnet's set temperature, and adjusting a proportional/integral/differential (PID) parameter for controlling the lower magnet temperature in the temperature control device according to the difference between the lower magnet's actual temperature and the lower magnet's set temperature.

Further, before determining the temperature of the magnet to which the current value of the cumulative energy of the gradient pulses corresponds according to the current value of the cumulative energy of the gradient pulses and the preset corresponding relationship, the current value of the cumulative energy of the gradient pulses can be calculated according to the formula $$E_{Gra} = \sum_n I_n^2 \times R_{GC} \times \tau_n;$$

wherein, $E_{Gra}$ represents the current value of the cumulative energy of the gradient pulses; n represents the nth gradient pulse applied before the current time, and n is a positive integer; $I_n$ represents the output current of the nth gradient pulse; $\tau_n$ represents the width of the nth gradient pulse; and $R_{GC}$ represents the resistance of a gradient coil.

The present invention also provides magnetic resonance imaging (MRI) equipment that includes a radio-frequency transmitting coil, a magnet for imaging by the MRI equipment, a gradient coil, a temperature sensor, a heating element, a filter board, a temperature control device, a heating power supply and a relay output. The temperature sensor measures the temperature of the magnet, so as to acquire the current value of the magnet temperature. The temperature control device stores a preset set temperature of the magnet, and to send a control signal to the heating power supply using a proportional/integral/differential PID parameter, so as to control the output power of the heating element to the magnet. The MRI equipment also has a memory module, for storing a corresponding relationship between a preset magnet temperature drifting trend and the cumulative energy of gradient pulses, a calculation module that obtains the corresponding relationship from the memory module and determines a magnet temperature corresponding to the current value of the cumulative energy of the gradient pulses according to the current value of the cumulative energy of the gradient pulses and the corresponding relationship. The calculation module uses the magnet temperature as the current predicted value of the magnet temperature. The MRI equipment further has an accumulator that receives the current predicted value of the magnet temperature from the calculation module and that weights the current measured value of the magnet temperature measured by the temperature sensor and the current predicted value of the magnet temperature from the calculation module by preset weight coefficients, so as to obtain an actual temperature of the magnet. The temperature control device further receives the actual temperature of the magnet from the accumulator, calculates the difference between the actual temperature of the magnet and the set temperature of the magnet, and adjusts the PID parameter according to this difference, and generates a control signal for keeping the magnet temperature constant according to the adjusted PID parameter.

In this case, the magnet can be formed by an upper magnet and a lower magnet and the memory module can store a corresponding relationship between the preset temperature drifting trend of the upper magnet and the cumulative energy of the gradient pulses, and a corresponding relationship between the temperature drifting trend of the lower magnet and the cumulative energy of the gradient pulses.

In this case, the calculation module can determine the temperature of the upper magnet corresponding to the current value of the cumulative energy of the gradient pulses according to the current value of the cumulative energy of the gradient pulses and the corresponding relationship between the temperature drifting trend of said upper magnet and the cumulative energy of the gradient pulses. The calculation module sends the temperature of the upper magnet to the accumulator as the current value of the temperature of the upper magnet, and determines the temperature of the lower magnet corresponding to the current value of the cumulative energy of the gradient pulses according to the current value of the cumulative energy of the gradient pulses and the corresponding relationship between the temperature drifting trend of said lower magnet and the cumulative energy of the gradient pulses, and sends the temperature of the lower magnet to the accumulator as the current value of the temperature of the lower magnet.

In this case, the temperature sensor can include an upper temperature sensor, for measuring the temperature of the upper magnet, so as to acquire the current measured value of the temperature of the upper magnet and to send it to the accumulator, and a lower temperature sensor, for measuring the temperature of the lower magnet, so as to acquire the current measured value of the temperature of the lower magnet and to send it to the accumulator.

In this case, the accumulator can include an upper accumulator, for receiving the current predicted value of the temperature of the upper magnet from the calculation module and the current measured value of the temperature of the upper magnet from the upper temperature sensor, and for weighting the current predicted value of the temperature of the upper magnet and the current measured value of the temperature of the upper magnet with preset weight coefficients, so as to obtain the actual temperature of the upper magnet and to send it to the temperature control device; and a lower accumulator, for receiving the current predicted value of the temperature of the lower magnet from the calculation module and the current measured value of the temperature of the lower magnet from the upper temperature sensor, and for weighting the current predicted value of the temperature of the lower magnet and the current measured value of the temperature of the lower magnet with preset weight coefficients, so as to obtain the actual temperature of the lower magnet and to send it to the temperature control device.

In this case, the heating element can include an upper heating element and a lower heating element. The temperature control device can store a preset set temperature of the upper magnet and a preset temperature of the lower magnet, and receives the actual temperature of the upper magnet from the upper accumulator and the actual temperature of the lower magnet from the lower accumulator, and calculates the difference between the actual temperature and the set temperature of the upper magnet, and adjusts the PID parameter of the temperature control device for the control of the output power of the upper heating element according to this difference. The temperature control device also calculates the difference between the actual temperature and the set temperature of the lower magnet, and adjusts the PID parameter of the temperature control device for the control of the output power of the lower heating element according to said difference.

The present invention also provides a method for improving the imaging quality of magnetic resonance imaging (MRI) equipment that includes the steps of presetting a corresponding relationship between a frequency drifting interference of MRI signals within an imaging field of view and the cumulative energy of gradient pulses, determining the frequency drifting interference corresponding to the current value of the cumulative energy of the gradient pulses according to the current value of the cumulative energy of the gradient pulses and the preset corresponding relationship, taking the frequency drifting interference as the current predicted value of the frequency drifting interference, and taking said current predicted value of the frequency drifting interference as a reference input signal to an adaptive filter, so as to obtain an output signal, and filtering out the output signal from the MRI signals obtained by scanning with the MRI equipment, so as to acquire the MRI signals for image reconstruction.

In this case, said MRI signals obtained by scanning with the MRI equipment can be: superposition signals of pure MRI signals and the frequency drifting interference signals caused by the heating effects of a gradient system.

In this case, said pure MRI signals are: one-dimensional signals or two-dimensional signals or three-dimensional signals.

The present invention also provides magnetic resonance imaging MRI equipment and includes a memory module that stores a preset corresponding relationship between the frequency drifting interference of MRI signals within an imaging field of view and the cumulative energy of gradient pulses, a calculation module, that receives the corresponding relationship from the memory module, calculates the frequency drifting interference according to the current value of the cumulative energy of the gradient pulses and the corresponding relationship provided by the memory module, taking said frequency drifting interference as the current predicted value of the frequency drifting interference and sending it to an adaptive filter. The adaptive filter receives the current predicted value of the frequency drifting interference from the calculation module, so as to obtain an output signal according to the input current predicted value of the frequency drifting interference. An accumulator receives the output signal from the adaptive filter, so as to filter out the output signal from the MRI signals obtained by scanning with the MRI equipment, and to acquire the MRI signals for image reconstruction.

In this case, the accumulator can also be used to feedback the MRI signals obtained for image reconstruction to the adaptive filter. The adaptive filter can also be used to adjust the values of a weight coefficient array in the adaptive filter according to the feedback MRI signals for image reconstruction from the accumulator.

It can be seen from the above technical solution that the present invention, firstly, presets the corresponding relationship between the deterioration factor for the imaging quality and the cumulative energy of gradient pulses applied by the continuous scanning MRI sequences, then determines the predicted value of the deterioration factor for the imaging quality according to the currently applied cumulative energy of gradient pulses and said corresponding relationship, and adopts corresponding method to perform dynamic regulation or compensation with reference to said predicted value of deterioration factor for the imaging quality, so that the influences produced by the heating effects of the gradient system on the imaging quality is cancelled. Since the technical solution of the present invention can make use of the results of several experiments to set the corresponding relationship between the deterioration factor for the imaging quality and the cumulative energy of gradient pulses applied by the continuous scanning MRI sequences, so that it predicts the value of the deterioration factor for the imaging quality corresponding to the different cumulative energy of gradient pulses, and the present invention adopts said predicted value as the reference for an actual dynamic regulation or compensation process, so the technical solution of the present invention is capable of more accurately and more synchronously performing regulation or compensation to the deterioration factor for the imaging quality, thereby obtaining the results of improved imaging quality.

BRIEF DESCRIPTION OF THE DRAWINGS

The above-mentioned and other features and advantages of the present invention will become more apparent to those skilled in the art by detailed description hereinbelow of the exemplary embodiments of the present invention with reference to the following drawings.

FIG. 6 is a flowchart of the method for improving the imaging quality of MRI equipment in a second embodiment of the present invention.

FIG. 7 is a schematic view of the construction structure of an adaptive filter of the MRI equipment in the second embodiment of the present invention.

DESCRIPTION OF THE PREFERRED EMBODIMENTS

Figure 1:
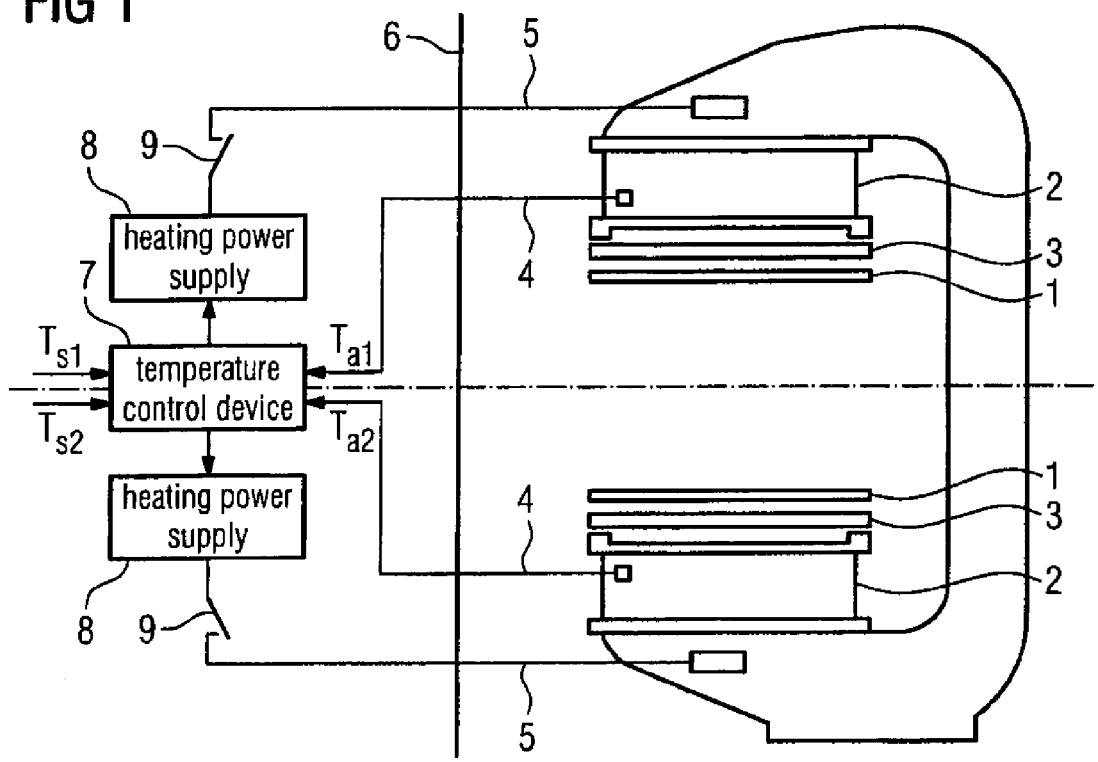
FIG. 1 is a schematic view of the construction structure of the MRI equipment corresponding to the first currently available technical solution.
Figure 2:
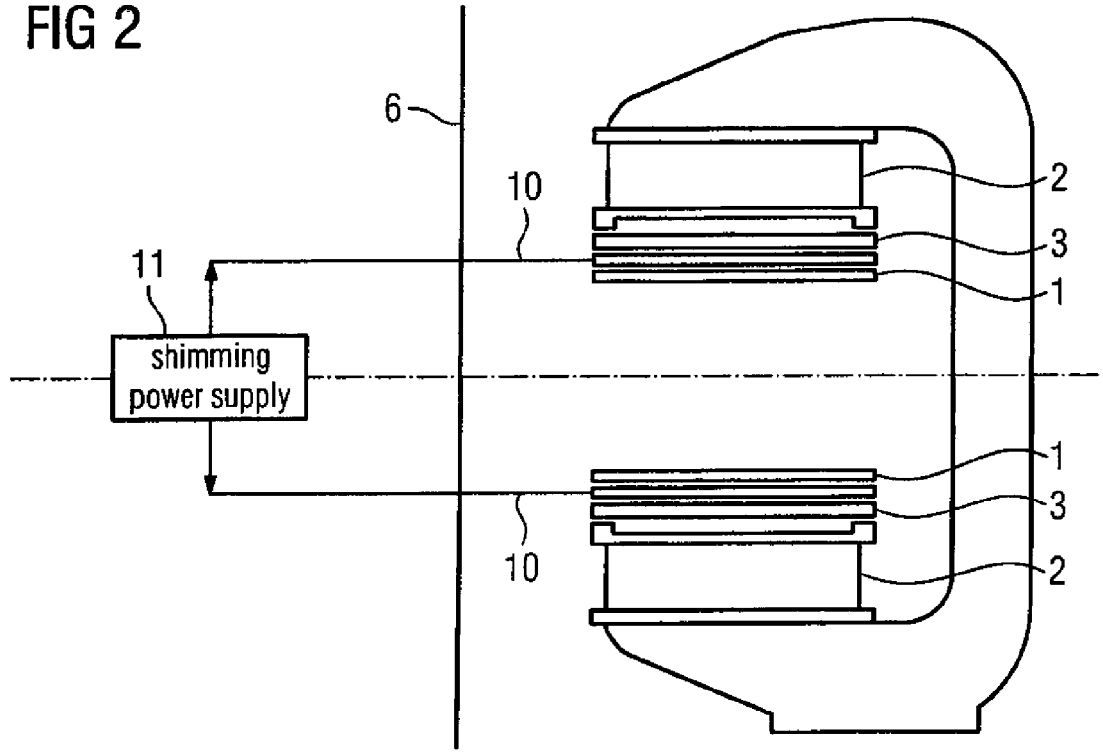
FIG. 2 is a schematic view of the construction structure of MRI equipment corresponding to the second currently available technical solution.

In order to make the objects, technical solutions and advantages of the present invention more apparent, the present invention will be further described in detail with reference to the accompanying drawings and embodiments.

During a scanning process in an MRI sequence excited by MRI equipment, it is necessary to apply gradient pulses with certain energy. Experiments have indicated that: correlations exist between the heating effects of a gradient system and the cumulative energy of the gradient pulses applied by the continuous scanning MRI sequences, and correlations exist between the magnet temperature drifting in MRI equipment, especially in permanent magnetic type of MRI equipment, and the heating effects of the gradient system.

The magnet temperature drifting will cause a field drifting, while the field drifting will directly cause frequency drifting, which indicates that: correlation exists between the frequency drifting and the magnet temperature drifting; while the frequency drifting will result in the deterioration of imaging quality.

The above-mentioned correlation can be expressed as:

cumulative energy of gradient pulse→heating effects by the gradient system→magnet temperature drifting→field drifting→frequency drifting→deterioration of the imaging quality.

It can be seen that, the temperature drifting, the field drifting and the frequency drifting are factors that directly or indirectly cause the imaging quality to deteriorate, and by dynamically regulating or compensating these factors, the goal of improving the imaging quality can be achieved. The abovementioned factors are referred to in simpler form as the deterioration factors for the imaging quality in subsequent description of the present invention.

The basic concept of the embodiments of the present invention is: to obtain corresponding relationships between the deterioration factors for the imaging quality and the cumulative energy of gradient pulses applied by the successive scanning MRI sequences (hereinafter referred to as the cumulative energy of gradient pulses in short), then to determine the current predicted value of deterioration factors for the imaging quality according to the current applied cumulative energy of the gradient pulses and the corresponding relationship, and to use a corresponding method to carry out dynamic regulation or compensation with reference to the predicted value of said deterioration factors for the imaging quality, so as to cancel the influence caused by the heating effects of the gradient system upon imaging quality. Since the technical solution of the present invention makes use of the results of many experiments to predict the values of the deterioration factors for the imaging quality corresponding to different cumulative energy of the gradient pulses, and adopts the predicted values as the reference in the actual dynamic regulation or compensation process, the technical solution of the present invention is capable of regulating or compensating the deterioration factors for the imaging quality more accurately and more synchronously, so as to achieve the results in improving imaging quality.

Based on the abovementioned concept, the present invention provides two methods for improving the imaging quality of MRI equipment and corresponding MRI equipments, which will be introduced respectively hereinbelow.

Embodiment One

This embodiment provides a technical solution in keeping the temperature of a magnet constant by use of the correlation between the magnet temperature drifting trend and the cumulative energy of gradient pulses.

Figure 3:
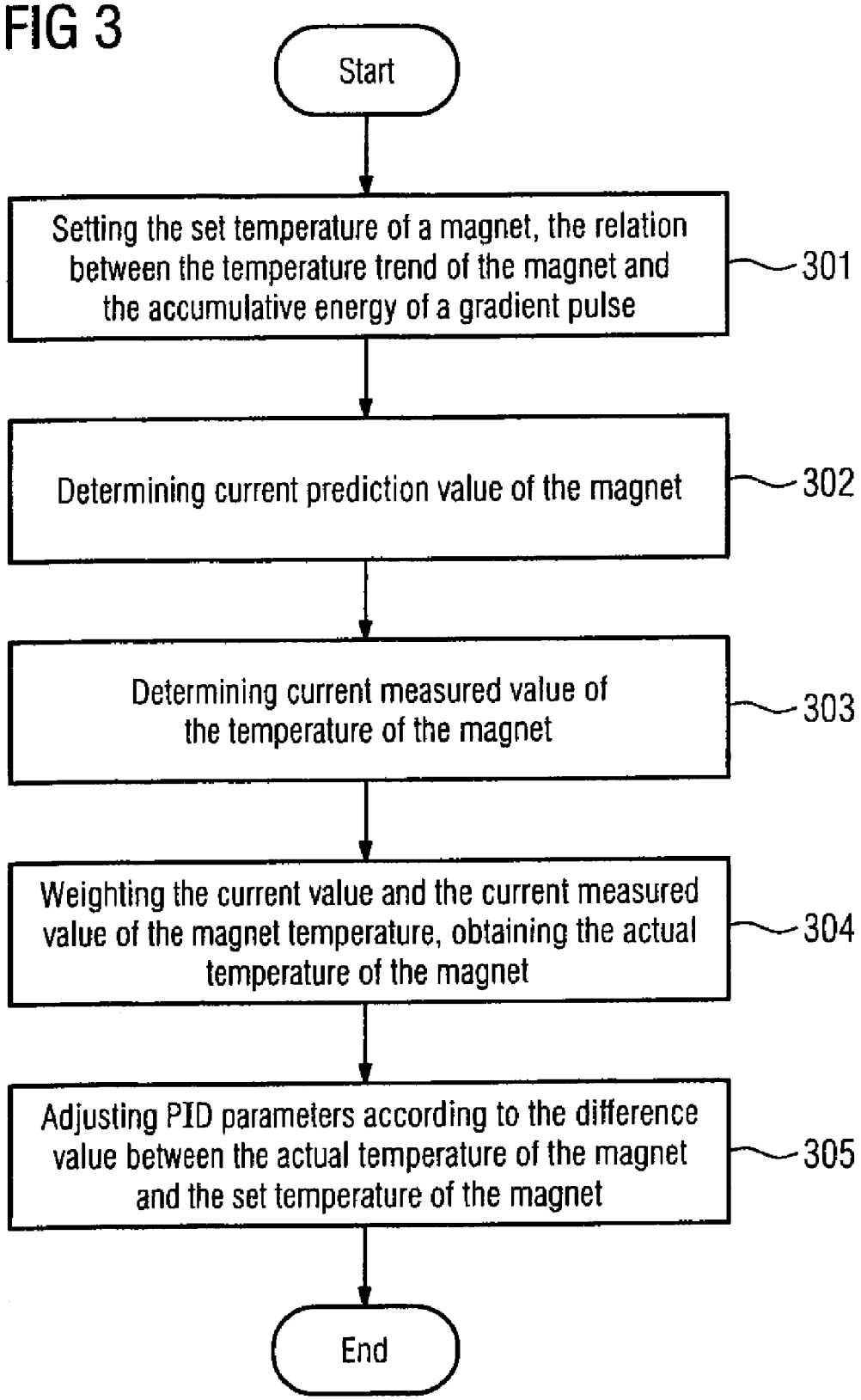
FIG. 3 is a flowchart of the method for improving the imaging quality of MRI equipment in a first embodiment of the present invention.

FIG. 3 is the schematic flowchart of the method of the first embodiment of the present invention for improving the imaging quality of MRI equipment. Referring to FIG. 3, the method comprises:

Step 301: presetting the set temperature of the magnet in a temperature control device, and presetting the corresponding relationship between the magnet temperature drifting trend of the magnet used in the MRI equipment for imaging and the cumulative energy of gradient pulses.

In this step, it can set respectively the set temperature of an upper magnet and the set temperature of a lower magnet, and, the corresponding relationship between the set magnet temperature drifting trend and the cumulative energy of gradient pulses can comprise: the corresponding relationship between the upper magnet temperature drifting trend and the cumulative energy of gradient pulse and the corresponding relationship between the lower magnet temperature drifting trend and the cumulative energy of gradient pulses.

Before performing said setting in this step, many experiments can be carried out, and, by the results of said experiments the corresponding relationship between the magnet temperature drifting trend and the cumulative energy of gradient pulses can be determined.

Step 302: determining the magnet temperature corresponding to the current value of the cumulative energy of gradient pulses according to the current value of the cumulative energy of gradient pulses and said preset corresponding relationship, and taking said magnet temperature as the current predicted value of the magnet temperature.

In this step, the equation (1)

$$E_{Gra} = \sum_n I_n^2 \times R_{GC} \times \tau_n \quad (1)$$

can be used to calculate the current value of the cumulative energy of gradient pulses.

In this case, $E_{Gra}$ represents the current value of the cumulative energy of gradient pulses;

n represents the nth gradient pulse applied before the current time, and n is a positive integer;

$I_n$ represents the output current of the nth gradient pulse;

$\tau_n$ represents the width of the nth gradient pulse; and $R_{GC}$ represents the resistance of a gradient coil.

After the current value of the cumulative energy of gradient pulses is obtained, the temperature of the upper magnet corresponding to the current value of the cumulative energy of gradient pulses can be determined, according to the corresponding relationship between the upper magnet temperature drifting trend and the cumulative energy of gradient pulses set in step 301, as the current predicted value of the upper magnet temperature; and the temperature of the lower magnet corresponding to the current value of the cumulative energy of gradient pulses can be determined according to the corresponding relationship between the lower magnet temperature drifting trend and the cumulative energy of gradient pulses set in step 301, as the current predicted value of the lower magnet temperature.

Step 303: measuring the current temperature of the magnet as the current measured value of the magnet temperature.

This step 303 will obtain the current measured value of the upper magnet temperature and the current measured value of the lower magnet temperature by the measurement. This step 303 and the step 302 can be interchanged in their execution order.

Step 304: weighting the current predicted value and the current measured value of said magnet temperature with preset weight coefficients, so as to obtain an actual magnet temperature.

Operation in this step is specifically by weighting the current predicted value and the current measured of the upper magnet temperature with the preset weight coefficients, to obtain the actual temperature of the upper magnet; and weighting the current predicted value and the current measured of the lower magnet temperature with the preset weight coefficients, to obtain the actual temperature of the lower magnet.

Here, any of the weight coefficients can be set according to the requirements of practical applications.

1) The same weight coefficients can be set for the upper magnet and the lower magnet, for example: set the weight coefficient of current predicted value as 0.6, and set the weight coefficient of current measured value as 0.4;

2) different weight coefficients can be set respectively for the upper magnet and for the lower magnet, for example: for the upper magnet, set the weight coefficient of current predicted value as 0.5, and set the weight coefficient of current measured value as 0.5;

for the lower magnet, set the weight coefficient of current predicted value as 0.7, and set the weight coefficient of current measured value as 0.3.

Step 305: regulating the PID parameters of the temperature control device according to the difference between the actual temperature and the set temperature of said magnet. The temperature control device is used to control and keep the temperature of said magnet constant according to said PID parameters.

In this step 305, the PID parameters of the temperature control device can be regulated by the same method as that of available technology according to the difference between the actual temperature and the set temperature of the magnet. This regulating is done by regulating the PID parameters for controlling the temperature of the upper magnet in the temperature control device according to the difference between the actual temperature and the set temperature of the upper magnet (that is, the PID parameters for controlling the output power of the upper heating element), and regulating the PID parameters for controlling the temperature of the lower magnet in the temperature control device according to the difference between the actual temperature and the setting temperature of the lower magnet. This step 305 can also use other ways to regulate the PID parameters according to the difference between the actual temperature and the set temperature of the magnet. For example: the PID parameters can be regulated according to the product of a preset coefficient and said difference.

Since the temperature for regulating the PID parameters in the present invention comes from three aspects: i.e. the set temperature of the magnet, the current measured value of the magnet temperature and the current predicted value of the magnet temperature, and, the current predicted value of the magnet temperature is the experience value obtained from many previous experiments, therefore, the regulation of PID parameters in the present invention can be more synchronized with the actual temperature drifting of the magnet, so as to restrain the temperature drifting of the magnet, and to achieve the goal of improving the imaging quality of MRI equipment.

This completes the basic steps of the method flow of this embodiment for improving the imaging quality of MRI equipment.

It can be seen from the abovementioned technical solution that, since the present invention is capable of predicting the temperature drifting trend of the magnet when different gradient pulse energies are applied on the basis of previous experiments, the control of said technical solution of the present invention to the output power of the heating element is made easier in keeping synchronization with the actual temperature of the magnet, i.e., the regulation effects of PID parameters are smoother, thereby the amplitude of the actual magnet temperature drifting can be significantly restrained. It can be seen that the technical solution provided by the embodiment, when compared with the available technical solution that detects the difference between the actual temperature and the set temperature of the magnet simply by using temperature sensor and regulates the output power of heating element according to said difference, effectively overcomes the problem that the regulation of PID parameters in the existing technical solution is difficult to ensure the synchronization of the control of heating power and the actual temperature drifting of the magnet (there exist relatively apparent hysteresis, advance or oscillation etc.), obtains good results in counteracting the heating effects by the gradient system, and achieves the goal of improving the imaging quality of MRI equipment.

The MRI equipment provided in the embodiment will be described below with reference to the accompanying drawings.

Figure 4:
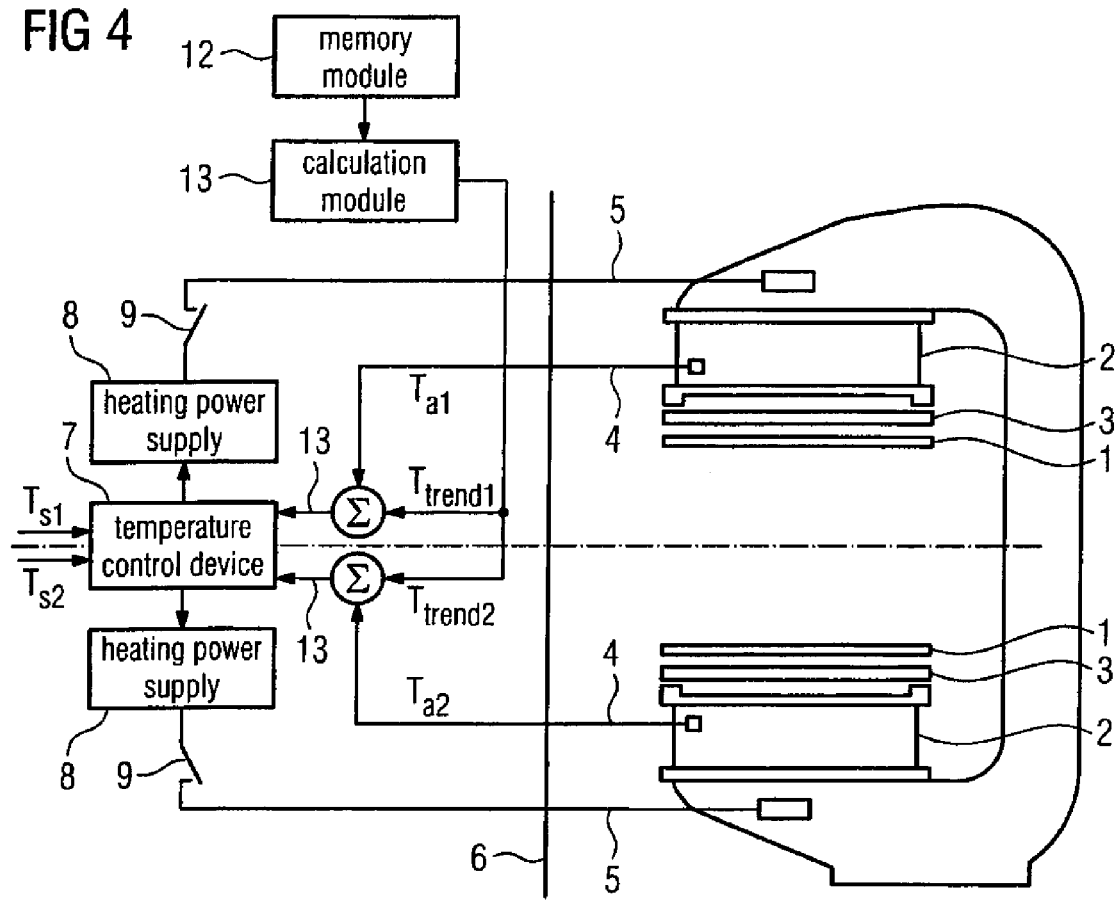
FIG. 4 is a schematic view of the construction structure of the MRI equipment in the first embodiment of the present invention.

FIG. 4 is a schematic view of the construction structure of the MRI equipment in the first embodiment of the present invention. Referring to FIG. 4, on the basis of the MRI equipment corresponding to the available first technical solution shown in FIG. 1, a memory module 12, a calculation module 13 and two accumulators 14 is added to the MRI equipment.

Most of the connection relationships among elements of the MRI equipment shown in FIG. 4 are the same as the connection relationships among the elements of the MRI equipment shown in FIG. 1, and taking the upper portion of the MRI equipment as an example, the common parts include the following.

The radio-frequency transmitting coil 1 and the gradient coil 3 are respectively wound on the magnet 2 of the MRI equipment, and the radio-frequency transmitting coil 1 is closer to the central transverse shaft than the gradient coil 3.

The temperature sensor 4 is connected to the magnet 2, for measuring the temperature of the magnet 2.

One side of the heating element 5 is connected to the magnet 2, and the other side is connected to relay output switch. 9, for regulating the output power of the magnet 2 according to the control of relay output switch 9, that is, for heating the magnet 2 with corresponding output power according to the control of relay output switch 9.

There are four channels of input signals and two channels of output control signals in the temperature control device 7; two of the four channels of input signals are respectively: the preset set temperature $T_{S1}$ of an upper magnet and set temperature $T_{S2}$ of a lower magnet; two channels of the output signal are respectively used to control an upper heating power supply 8 and a lower heating power supply 8.

The heating power supply 8 is used to turn-on or turn-off the power supply of the relay output switch 9 according to the control signal received from the temperature control device 7.

A filter board 6 is located between the left half portion of elements and the right half portion of elements. The left half portion of elements include a temperature control device 7, a heating power supply 8 and a relay output switch 9, and the right half portion of elements include: a radio-frequency transmitting coil 1, a magnet 2, a gradient coil 3, a temperature sensor 4 and a heating element 5.

The differences between the MRI equipment shown in FIG. 4 and the MRI equipment shown in FIG. 1 are as follows.

The MRI equipment shown in FIG. 4 has a memory module 12, for storing the corresponding relationship between the preset magnet temperature drifting trend and the cumulative energy of gradient pulses, and for providing said corresponding relationship to a calculation module 13.

The calculation module 13 determines the magnet temperature corresponding to the current value of the cumulative energy of gradient pulses according to the current value of the cumulative energy of gradient pulses and the corresponding relationship provided by the memory module 12 using the magnet temperature as the current predicted value of the magnet temperature, and sends it to an accumulator 14.

The temperature measured by the temperature sensor 4 is used as one of the input signals to an accumulator 14.

The accumulator 14 weights the current measured value of the magnet temperature measured by the temperature sensor 4 and the current predicted value of the magnet temperature coming from the calculation module 13 with preset weight coefficients, so as to obtain the actual temperature of the magnet, and to send it to a temperature control device 7.

The temperature control device 7, receives the actual temperature of the magnet from the accumulator 14, calculates the difference between the actual temperature and the set temperature of said magnet, regulating the PID parameters according to said difference, and generates the control signal for keeping the magnet temperature constant according to said regulated PID parameters, that is, generating the control signal for controlling the upper heating power supply 8 and the lower heating power supply 8.

In the above description, the functions of various elements and the connection relationships between the elements of the MRI equipment shown in FIG. 4 are described by taking the upper portion of the MRI equipment as an example, when involving the upper and lower two portions, the functions of various elements and the connection relationships between them are as follows.

The memory module 12 is used for storing the preset corresponding relationship between the upper magnet temperature drifting trend and the cumulative energy of gradient pulses and the preset corresponding relationship between the lower magnet temperature drifting trend and the cumulative energy of gradient pulse.

The calculation module 13 is used for determining the upper magnet temperature corresponding to the current value of the cumulative energy of gradient pulses according to the current value of the cumulative energy of gradient pulses and the corresponding relationship between the upper magnet temperature drifting trend and the cumulative energy of gradient pulse, using the upper magnet temperature as the current predicted value of the upper magnet temperature and sending it to the upper accumulator 14. This calculation module 13 determines the lower magnet temperature corresponding to the current value of the cumulative energy of gradient pulses according to the current value of the cumulative energy of gradient pulses and the corresponding relationship between the lower magnet temperature drifting trend and the cumulative energy of gradient pulses, taking said lower magnet temperature as the current predicted value of the lower magnet temperature, and sends it to the lower accumulator 14.

The temperature sensor 4 includes an upper temperature sensor and a lower temperature, respectively for measuring the temperature of upper/lower magnet, to obtain the current measured value of upper/lower magnet temperature, and to send it to the upper accumulator and lower accumulator, respectively.

The accumulator 14 includes an upper accumulator, for receiving the current predicted value of the upper magnet temperature from the calculation module 13 and the current measured value of the upper magnet temperature from the upper temperature sensor, for weighting the current predicted value of upper magnet temperature and the current measured value of the upper magnet temperature with preset weight coefficients, so as to obtain the actual temperature of the upper magnet, and to send it to the temperature control device 7.

The accumulator 14 also includes a lower accumulator, for receiving the current predicted value of the lower magnet temperature from the calculation module 13 and the current measured value of the lower magnet temperature from the lower temperature sensor, for weighting the current predicted value of the lower magnet temperature and the current measured value of the lower magnet temperature with preset weight coefficients, so as to obtain the actual temperature of the lower magnet, and to send it to the temperature control device 7.

The temperature control device 7 is used for storing the preset set temperature of the upper magnet and the preset set temperature of the lower magnet, receiving the actual temperature of the upper magnet from the upper accumulator and the actual temperature of the lower magnet from the lower accumulator, and calculating the difference between the actual temperature and the set temperature of the upper magnet, to regulate PID parameters in the temperature control device 7 for controlling the output power of the upper heating element; and for calculating the difference between the actual temperature and the set temperature of the lower magnet, to regulate PID parameters in the temperature control device 7 for controlling the output power of the lower heating element.

Figure 5:
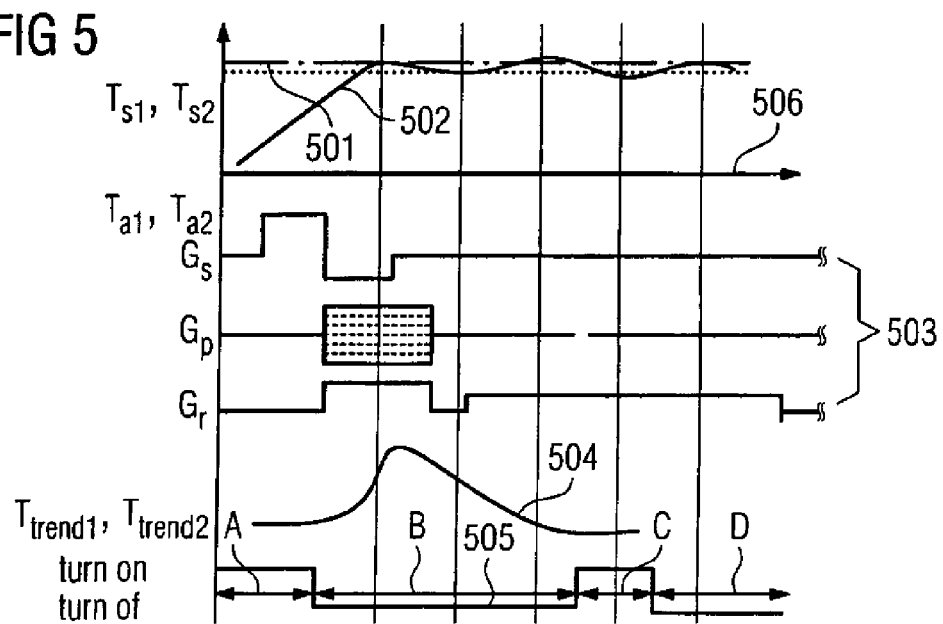
FIG. 5 is a schematic view of a temperature controlling process of the first embodiment of the present invention.

FIG. 5 is a schematic view of the temperature controlling procedure of the first embodiment of the present invention. Referring to FIG. 5, in which:

straight lines 501 represent set temperatures, comprising: a set temperature $T_{S1}$ of the upper magnet and a set temperature $T_{S2}$ of the lower magnet;

curved lines 502 represent measured temperatures, that is, the current measured value of magnet temperature, comprising: a measured temperature $T_{a1}$ of the upper magnet and a measured temperature $T_{a2}$ of the lower magnet;

lines 503 represent the applied gradient pulses, including slice-selecting gradient pulses (Gs), phase coding (Gp) and readout gradient (Gr);

curved lines 504 represent the prediction of the magnet temperature drifting trends obtained from the corresponding relationships between the magnet temperature drifting trends and the cumulative energy of gradient pulses;

line 505 represents the turn-on/turn-off time of heating power supply; and the horizontal coordinate 506 represents time.

It can be seen from above description that, the embodiment, by adding to the available MRI equipment a calculation module for storing the corresponding relationships between the magnet temperature drifting trends and the cumulative energy of gradient pulses and for calculating the current predicted values of the magnet temperature according to the current values of the cumulative energy of gradient pulses and the corresponding relationships, and an accumulator for weighting the current predicted value and the current measured value of the magnet temperature to obtain the actual temperature of the magnet, is capable of connecting the predicted magnet temperature drifting trends based on previous experiments and the magnet temperatures obtained from practical measurement and of dynamically regulating the output powers of heating elements, to keep the magnet temperature constant, thereby effectively improve the imaging quality of MRI equipment.

Embodiment Two

This embodiment provides a technical solution for dynamically filtering the frequency drifting interference in MRI signals by use of the correlation of the frequency drifting interference of MRI signals within the imaging field of view and the cumulative energy of gradient pulses.

FIG. 6 is a flowchart of the method for improving the imaging quality of MRI equipment in the second embodiment of the present invention. Referring to FIG. 6, the method includes the following steps.

Step 601: presetting the corresponding relationship between the frequency drifting interference of MRI equipment within the imaging field of view and the cumulative energy of gradient pulses.

Before performing the setting in this step 601, many experiments can be carried out, and, by experimental results the corresponding relationship between the frequency drifting interference of MRI signals within the imaging field of view and the cumulative energy of gradient pulses is determined.

Step 602: determining the frequency drifting interference corresponding to the current value of the cumulative energy of gradient pulses according to the current value of the cumulative energy of gradient pulses and said preset corresponding relationship, taking the frequency drifting interference as the current predicted value of frequency drifting interference, and taking the current value of frequency drifting interference as a reference input signal, to obtain an output signal.

In this step 601, the current value of the cumulative energy of gradient pulses can be calculated according to formula (1) in the first embodiment, and the frequency drifting interference corresponding to the cumulative energy of gradient pulses is obtained according to the corresponding relationship between the preset frequency drifting interference of MRI signals within the imaging field of view and the cumulative energy of gradient pulses in step 601. The frequency drifting interference is a prediction of actual current frequency drifting interference, therefore, the frequency drifting interference is regarded here as the current predicted value of frequency drifting interference. The current predicted value of frequency drifting interference is input as a reference input signal to an adaptive filter, and a corresponding output signal can be obtained, which output signal is close to the frequency drifting interference signal contained in current MRI signals, therefore the frequency drifting interference signal should be filtered out from MRI signals.

Step 603: filtering the output signal from MRI signals obtained by scanning with the MRI equipment, so as to obtain the MRI signals for image reconstruction.

The MRI signals obtained by scanning with MRI equipment in the step are the superposition of pure MRI signals and frequency drifting interference signals caused by the heating effects of the gradient system. Said pure MRI signals are MRI signals without an interference source.

This completes the basic steps in the method of this embodiment for improving imaging quality of MRI equipment.

In the method for improving imaging quality of MRI equipment shown in FIG. 6, an adaptive filter is needed. Generally, it is necessary to carry out model-building for the filter prior to the normal operation of the filter. The model building process is a process for determining the weight coefficient array of the filter. The weight coefficient array of the filter reflects the relationships between the input signals and the output signals of the filter, and for an adaptive filter, said weight coefficient array can be adaptively regulated according to feedback signals, so as to make the relationships between the input signals and the output signals correspond better to the respective conditions.

The model building process for the adaptive filter will be described below by referring to the accompanying drawings. FIG. 7 shows a schematic view of the model building process of the adaptive filter device in the present invention for improving the imaging quality of MRI equipment. Referring to FIG. 7, the adaptive filter device comprises: a memory module 710, a calculation module 720, an adaptive filter 730, a first accumulator 740 and a second accumulator 750. The meaning of various signals and physical quantities related to the adaptive filter device areas follows:

(1): $s(n,m,l)$ is a pure MRI signal without any interference source in it, which is a known signal in the model building process;

(2): $v_0(n,m,l)$ is the actual frequency drifting interference signal caused by the heating effect of the gradient system, which is a known signal in the model building process;

(3): $d_j=s(n,m,l)+v_0(n,m,l)$ is the MRI signal containing the frequency drifting interference signal, i.e., the result of the superposition of $s(n,m,l)$ and $v_0(n,m,l)$ conducted by the second accumulator 750, which is used as one of the input signals of the first accumulator 740;

(4): $E_{Gra}(n)$ is the cumulative energy of gradient pulses when running the nth MRI sequence, whose calculation formula is formula (1) in the first embodiment;

(5): $v_1(n,m,l)$ represents the frequency drifting interference caused by the cumulative energy of gradient pulses $E_{Gra}(n)$, being used as the reference input signal $x_j$ of the adaptive filter (AF) 730;

(6): $h(n,m,1)$ is stored in the memory module 710 as the correlation array used in the calculation module 720, $h(n,m,1)$ is the correlation array of $E_{Gra}^{(n)}$ and $v_1(n,m,1)$ obtained by a number of experiments, which correlation array is the corresponding relationship between the frequency drifting interference and the cumulative energy of gradient pulses mentioned in the present invention, and reflects a one to one corresponding relationship between $E_{Gra}^n$ and $v_1(n,m,1)$;

(7): $y_j$ is the output signal of the adaptive filter 730, whose relationship with the reference input signal of the adaptive filter 730 and the weight coefficient array W can be expressed as: $y_j=x_j^\tau W$, wherein, W is a function of feedback signal $e_j$;

(8): feedback signal $e_j$ is the approximated value of $s(n,m,l)$, for the MRI signals of image reconstruction, which is obtained by subtracting $y_j=x_j^\tau W$ from $d_j=s(n,m,l)+v_0(n,m,l)$ with the first accumulator 740, that is, obtained by filtering the approximated value of the frequency drifting interference from the MRI signals containing frequency drifting interference signals.

During the model building process, a certain algorithm is required to determine the value of W, to make $y_j$ approach $v_0(n,m,l)$, so as to filter the frequency drifting interference signals from $d_j=s(n,m,l)+v_0(n,m,l)$ as much as possible. As seen in FIG. 7, the relationship among various signals and physical quantities is as follows:

$$e_j=d_j-y_j \quad (2)$$

$$y_j=x_j^\tau W \quad (3)$$

Since during the model building process, the pure MRI signal $s(n,m,l)$ and the actual frequency drifting interference signal $v_0(n,m,l)$ are all known quantities, that is: $d_j$ in formula (2) is given, while in formula (3), W is a function of the feedback signal $e_j$, therefore the above two formulae actually contain two unknown quantities: W and $y_j$, the formulae (2) and (3) can be combined together, expressing $y_j$ with W, so to obtain the function relationship between $y_j$ with W. In order to make $y_j$ approach the frequency drifting interference $v_0(n,m,l)$ in the MRI signal caused by the heating effects of the gradient system, the least mean square (LMS) of $y_j$ and $v_0(n,m,l)$ can be calculated, and by working out the value assumed by $y_j$ when the LMS is of its minimum, thereby determine the value of W.

This completes the model building of the adaptive filter of the present invention.

In a practical application, $s(n,m,1)$ and $v_0(n,m,1)$ will be unknown, the MRI signals will directly be the MRI signals containing frequency drifting interference signals, that is: the signal (3): $d_j$, as shown in FIG. 7. During the subsequent utilization process, the adaptive filter will not continuously regulate the weight coefficient array value of W according to the feedback signal $e_j$ to make its output $y_j$ approach the frequency drifting interference $v_0(n,m,1)$ in the MRI signal caused by the heating effects of the gradient system, until the LMS among them is the minimum, thereby making the MRI signals for imaging reconstruction unlimitedly approaching the ideal MRI signals without interference in them, so as to achieve the goal of adaptively filtering. The algorithm of adaptive filtering can adopt the relatively matured current Steepest Descent Method.

According to the above description, corresponding to the method of the present invention for improving the imaging quality of MRI equipment, the MRI equipment of the present invention can be obtained, which MRI equipment needs to add on the base of the available MRI equipment the following modules:

a memory module 710, for storing the preset corresponding relationship between the frequency drifting interference of MRI signals within the imaging field of view and the cumulative energy of gradient pulses, and for providing the calculation memory 720 with said corresponding relationship;

a calculation module 720, for calculating the frequency drifting interference according to the current value of the cumulative energy of gradient pulses and the corresponding relationship provided by said memory module, taking the frequency drifting interference as the current predicted value of frequency drifting interference, and sending the current predicted value of the frequency drifting interference to the adaptive filter 730;

an adaptive filter 730, for obtaining corresponding output signals according to the input current predicted value of the frequency drifting interference, and sending the output signal to the first accumulator 740; and a first accumulator 740, for filtering the output signal from the MRI signals obtained through the scanning by the MRI equipment, to obtain the MRI signals for image reconstruction.

Preferably, the first accumulator 740 is also used to feed the obtained MRI signals for image reconstruction back to said adaptive filter 730, and the adaptive filter 730 is also used to regulate the value of weight coefficient array in the adaptive filter 730 according to the MRI signals for image reconstruction fed back by, the accumulator 730.

In practical applications, the MRI signals source can be:
1) one-dimensional signals (m,1=0)—MRI central frequency. By using the above adaptive filter 730, the MRI central frequency drifting caused by the heating effects of the gradient system can be dynamically filtered, and the deterioration in imaging quality (e.g., the appearance of artifacts) caused thereby is eliminated so as to achieve the goal of improving imaging quality;
2) two-dimensional signals (I=0) or three-dimensional signals, which are MRI baseband signals (i.e., raw data) obtained by demodulating the received MRI radio-frequency signals. By using the above adaptive filter 730, the frequency drifting interference of MRI baseband signals caused by the heating effects of the gradient system can be dynamically eliminated, thereby not deteriorating due to the heating effects of the gradient system the imaging quality obtained by image reconstruction (for example, ghost images, artifacts, etc.), so as to achieve the goal of improving imaging quality.

This embodiment achieves the goal of improving imaging quality by presetting the corresponding relationship between the frequency drifting interference of the MRI signals within the field of view and the cumulative energy of gradient pulses, and by adding an adaptive filter in the MRI equipment to cancel the frequency drifting interference of the MRI signals. The adaptive filter has the advantages of simple system structure and mature algorithm, it can dynamically filter the frequency drifting in the magnet resonance signals caused by the heating effects of the gradient system by taking the cumulative energy of gradient pulses applied during the MRI scanning process and the frequency drifting trend of MRI signals caused thereby as the template of the reference input of the adaptive filter. The manner for its implementation thereof is flexible, and it can be realized not only by hardware (for example, programmable device such as DSP, FPGA, etc.) but also by software; so the costs are lower than the currently available solving solutions.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for improving the imaging quality of nuclear magnetic resonance imaging (MRI) equipment, comprising:

presetting a corresponding relationship between a magnet temperature drifting trend of a magnet used for imaging by the MRI equipment and the cumulative energy of gradient pulses, and presetting a set temperature for the magnet;

determining the temperature of the magnet to which the current value of the cumulative energy of the gradient pulses corresponds according to the current value of the cumulative energy of the gradient pulses and said preset corresponding relationship, and using said magnet temperature as a current predicted value of the magnet temperature;

measuring a current temperature of the magnet as the current measured value of the magnet temperature;

weighting the current predicted value and the current measured value of the magnet temperature with preset weight coefficients, so as to obtain an actual temperature of the magnet; and adjusting a proportional/integral/differential (DIP) parameter of a temperature control device according to the difference between the magnet's actual temperature and set temperature, so as to keep the temperature of the magnet constant.

2. The method as claimed in claim 1, wherein said magnet comprises an upper magnet and a lower magnet;

said presetting the corresponding relationship between the magnet temperature drifting trend and the cumulative energy of gradient pulses comprises: presetting a corresponding relationship between the temperature drifting trend of the upper magnet and the cumulative energy of the gradient pulses and a corresponding relationship between the temperature drifting trend of the lower magnet and the cumulative energy of the gradient pulses; and said presetting the set temperature for the magnet comprises: presetting a set temperature for the upper magnet and a set temperature for the lower magnet.

3. The method as claimed in claim 2, wherein said determining the temperature of the magnet to which the current value of the cumulative energy of the gradient pulses corresponds according to the current value of the cumulative energy of the gradient pulses and said preset corresponding relationship comprises:

determining the temperature of the upper magnet to which the current value of the cumulative energy of the gradient pulses corresponds according to the current value of the cumulative energy of the gradient pulses and the corresponding relationship between the temperature drifting trend of the upper magnet and the cumulative energy of the gradient pulses; and determining the temperature of the lower magnet to which the current value of the cumulative energy of the gradient pulses corresponds according to the current value of the cumulative energy of the gradient pulses and the corresponding relationship between the drifting trend of the lower magnet and the cumulative energy of the gradient pulses; and said using said magnet temperature as the current predicted value of the magnet temperature comprises: using said determined temperature of the upper magnet corresponding to the current value of the cumulative energy of the gradient pulses as the current predicted value of the upper magnet temperature; and using said determined temperature of the lower magnet corresponding to the current value of the cumulative energy of the gradient pulses as the current predicted value of the lower magnet temperature.

4. The method as claimed in claim 3, wherein said measuring the current temperature of the magnet as the current measured value of the magnet temperature comprises:

measuring a current temperature of the upper magnet to obtain the current measured value of the upper magnet temperature; and measuring a current temperature of the lower magnet to obtain the current measured value of the lower magnet temperature.

5. The method as claimed in claim 4, wherein said weighting the current predicted value and the current measured value of the magnet temperature with preset weight coefficients, so as to obtain the actual temperature of the magnet comprises:

weighting the current predicted value of the upper magnet temperature and the current measured value of the upper magnet temperature with the preset weight coefficients, so as to obtain an actual temperature of the upper magnet; and weighting the current predicted value of the lower magnet temperature and the current measured value of the lower magnet temperature with the preset weight coefficients, so as to obtain an actual temperature of the lower magnet.

6. The method as claimed in claim 5, wherein said adjusting the proportional/integral/differential (PID) parameter of the temperature control device according to the difference between the magnet's actual temperature and set temperature comprises:

adjusting a proportional/integral/differential (PID) parameter for controlling the upper magnet temperature in the temperature control device according to the difference between the upper magnet's actual temperature and the upper magnet's set temperature; and adjusting a proportional/integral/differential (PID) parameter for controlling the lower magnet temperature in the temperature control device according to the difference between the lower magnet's actual temperature and the lower magnet's set temperature.

7. The method as claimed in claim 6, wherein, before said determining the temperature of the magnet to which the current value of the cumulative energy of the gradient pulses corresponds according to the current value of the cumulative energy of the gradient pulses and said preset corresponding relationship, it further comprises: calculating the current value of the cumulative energy of the gradient pulses according to the formula:

$$E_{Gra} = \sum_n I_n^2 \times R_{GC} \times \tau_n;$$

wherein, $E_{GM}$ represents the current value of the cumulative energy of the gradient pulses;

n represents the nth gradient pulse applied before the current time, and n is a positive integer;

$I_n$ represents the output current of the nth gradient pulse;

$\tau_n$ represents the width of the nth gradient pulse; and $R_{GC}$ represents the resistance of a gradient coil.

8. A magnetic resonance imaging (MRI) equipment, comprising: a radio frequency transmitting coil, a magnet for imaging by the MRI equipment, a gradient coil, a temperature sensor, a heating element, a filter board, a temperature control device, a heating power supply and a relay output, wherein:

said temperature sensor is used to measure the temperature of the magnet, so as to acquire the current value of the magnet temperature;

said temperature control device is used to store a preset set temperature of the magnet, and to send a control signal to the heating power supply using a proportional/integral/differential PID parameter, so as to control the output power of the heating element to the magnet;

wherein:

said MRI equipment also comprises: a memory module, for storing a corresponding relationship between a preset magnet temperature drifting trend and the cumulative energy of gradient pulses;

a calculation module, for obtaining said corresponding relationship from the memory module, for determining a magnet temperature corresponding to the current value of the cumulative energy of the gradient pulses according to the current value of the cumulative energy of the gradient pulses and said corresponding relationship, and for using said magnet temperature as the current predicted value of the magnet temperature;

an accumulator, for receiving the current predicted value of the magnet temperature from the calculation module, for weighting the current measured value of the magnet temperature measured by the temperature sensor (4) and the current predicted value of the magnet temperature from the calculation module by preset weight coefficients, so as to obtain an actual temperature of the magnet; and said temperature control device is further used to receive the actual temperature of the magnet from the accumulator, to calculate the difference between the actual temperature of said magnet and the set temperature of said magnet, to adjust the PID parameter according to said difference, and is used to generate a control signal for keeping the magnet temperature constant according to said adjusted PID parameter.

9. The MRI equipment as claimed in claim 8, wherein:

said magnet comprises: an upper magnet and a lower magnet; and said memory module is used to store a corresponding relationship between the preset temperature drifting trend of the upper magnet and the cumulative energy of the gradient pulses and a corresponding relationship between the temperature drifting trend of the lower magnet and the cumulative energy of the gradient pulses.

10. The MRI equipment as claimed in claim 9, wherein:

said calculation module is used to determine the temperature of the upper magnet corresponding to the current value of the cumulative energy of the gradient pulses according to the current value of the cumulative energy of the gradient pulses and the corresponding relationship between the temperature drifting trend of said upper magnet and the cumulative energy of the gradient pulses, and to send said temperature of the upper magnet to the accumulator as the current value of the temperature of the upper magnet, and is used to determine the temperature of the lower magnet corresponding to the current value of the cumulative energy of the gradient pulses according to the current value of the cumulative energy of the gradient pulses and the corresponding relationship between the temperature drifting trend of said lower magnet and the cumulative energy of the gradient pulses, and to send said temperature of the lower magnet to the accumulator (14) as the current value of the temperature of the lower magnet.

11. The MRI equipment as claimed in claim 10, wherein said temperature sensor comprises:
an upper temperature sensor, for measuring the temperature of the upper magnet, so as to acquire the current measured value of the temperature of the upper magnet and to send it to the accumulator; and
a lower temperature sensor, for measuring the temperature of the lower magnet, so as to acquire the current measured value of the temperature of the lower magnet and to send it to the accumulator.

12. The MRI equipment as claimed in claim 11, wherein said accumulator comprises:
an upper accumulator, for receiving the current predicted value of the temperature of the upper magnet from the calculation module and the current measured value of the temperature of the upper magnet from the upper temperature sensor, and for weighting the current predicted value of the temperature of the upper magnet and the current measured value of the temperature of the upper magnet with preset weight coefficients, so as to obtain the actual temperature of the upper magnet and to send it to the temperature control device;
a lower accumulator, for receiving the current predicted value of the temperature of the lower magnet from the calculation module and the current measured value of the temperature of the lower magnet from the upper temperature sensor, and for weighting the current predicted value of the temperature of the lower magnet and the current measured value of the temperature of the lower magnet with preset weight coefficients, so as to obtain the actual temperature of the lower magnet and to send it to the temperature control device.

13. The MRI equipment as claimed in claim 12, wherein said heating element comprises: an upper heating element and a lower heating element;
said temperature control device is used to store a preset set temperature of the upper magnet and a preset set temperature of the lower magnet, to receive the actual temperature of the upper magnet from the upper accumulator and the actual temperature of the lower magnet from the lower accumulator, and to calculate the difference between the actual temperature and the set temperature of the upper magnet, and to adjust the PID parameter of the temperature control device for the control of the output power of the upper heating element according to said difference, and also to calculate the difference between the actual temperature and the set temperature of the lower magnet, and to adjust the PID parameter of the temperature control device for the control of the output power of the lower heating element according to said difference.

14. A method for improving the imaging quality of nuclear magnetic resonance imaging (MRI) equipment, wherein the method comprises:
presetting a corresponding relationship between a frequency drifting interference of MRI signals within an imaging field of view and the cumulative energy of gradient pulses;
determining the frequency drifting interference corresponding to the current value of the cumulative energy of the gradient pulses according to the current value of the cumulative energy of the gradient pulses and said preset corresponding relationship, taking said frequency drifting interference as the current predicted value of the frequency drifting interference, and taking said current predicted value of the frequency drifting interference as a reference input signal to an adaptive filter, so as to obtain an output signal; and
filtering out said output signal from the MRI signals obtained by scanning with the MRI equipment, so as to acquire the MRI signals for image reconstruction.

15. The method as claimed in claim 14, wherein said MRI signals obtained by scanning with the MRI equipment are:
superposition signals of pure MRI signals and the frequency drifting interference signals caused by the heating effects of a gradient system.

16. The method as claimed in claim 14, wherein said pure MRI signals are: one-dimensional signals or two-dimensional signals or three-dimensional signals.

17. Magnetic resonance imaging MRI equipment, comprising:
a memory module, for storing a preset corresponding relationship between the frequency drifting interference of MRI signals within an imaging field of view and the cumulative energy of gradient pulses;
a calculation module, for receiving the corresponding relationship from the memory module, calculating the frequency drifting interference according to the current value of the cumulative energy of the gradient pulses and said corresponding relationship provided by the memory module, taking said frequency drifting interference as the current predicted value of the frequency drifting interference and sending it to an adaptive filter;
the adaptive filter, for receiving the current predicted value of the frequency drifting interference from the calculation module, so as to obtain an output signal according to the input current predicted value of the frequency drifting interference; and
a first accumulator, for receiving the output signal from the adaptive filter, so as to filter out said output signal from the MRI signals obtained by scanning with the MRI equipment, and to acquire the MRI signals for image reconstruction.

18. The MRI equipment as claimed in claim 17, wherein:
said first accumulator is also used to feedback the MRI signals obtained for image reconstruction to said adaptive filter; and
said adaptive filter is also used to adjust the values of a weight coefficient array in said adaptive filter according to the feedback MRI signals for image reconstruction from the accumulator.

* * * * *